(12) United States Patent
Bi et al.

(10) Patent No.: US 10,263,075 B2
(45) Date of Patent: Apr. 16, 2019

(54) NANOSHEET CMOS TRANSISTORS

(71) Applicant: INTERNATIONAL BUSINESS MACHINES CORPORATION, Armonk, NY (US)

(72) Inventors: Zhenxing Bi, Niskayuna, NY (US); Kangguo Cheng, Schenectady, NY (US); Juntao Li, Cohoes, NY (US); Peng Xu, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/805,700

(22) Filed: Nov. 7, 2017

(65) Prior Publication Data

US 2018/0277630 A1 Sep. 27, 2018

Related U.S. Application Data

(63) Continuation of application No. 15/470,352, filed on Mar. 27, 2017.

(51) Int. Cl.
| | |
|---|---|
| *H01L 21/324* | (2006.01) |
| *H01L 29/06* | (2006.01) |
| *H01L 25/07* | (2006.01) |
| *H01L 25/00* | (2006.01) |
| *H01L 29/08* | (2006.01) |
| *H01L 21/28* | (2006.01) |

(52) U.S. Cl.
CPC .... *H01L 29/0684* (2013.01); *H01L 21/28255* (2013.01); *H01L 21/324* (2013.01); *H01L 25/07* (2013.01); *H01L 25/50* (2013.01); *H01L 29/0843* (2013.01)

(58) Field of Classification Search
None
See application file for complete search history.

(56) References Cited

U.S. PATENT DOCUMENTS

| | | | |
|---|---|---|---|
| 8,183,104 B2 * | 5/2012 | Hobbs | H01L 21/823821 438/275 |
| 9,224,810 B2 * | 12/2015 | Kim | H01L 21/823807 |
| 9,287,357 B2 | 3/2016 | Rodder et al. | |
| 9,362,355 B1 | 6/2016 | Cheng et al. | |
| 9,461,114 B2 | 10/2016 | Obradovic et al. | |
| 2015/0295084 A1 | 10/2015 | Obradovic et al. | |
| 2015/0364542 A1 | 12/2015 | Rodder et al. | |
| 2015/0364546 A1 | 12/2015 | Rodder et al. | |
| 2016/0020305 A1 | 1/2016 | Obradovic et al. | |

(Continued)

OTHER PUBLICATIONS

List of IBM Patents or Patent Applications Treated as Related dated Nov. 7, 2017, 2 pages.

(Continued)

*Primary Examiner* — Chandra Chaudhari
(74) *Attorney, Agent, or Firm* — Tutunjian & Bitetto, P.C.; Vazken Alexanian

(57) ABSTRACT

Methods of forming integrated chips include forming a respective stack of sheets in two regions, each stack having first layers and second layers. The second layers are etched away in the first region. The second region is annealed to change the composition of the first layers in the second region by interaction with the second layers in the second region. A gate stack is formed in the first and second region.

15 Claims, 6 Drawing Sheets

(56) References Cited

U.S. PATENT DOCUMENTS

2016/0071729 A1    3/2016   Hatcher et al.
2016/0126310 A1    5/2016   Rodder et al.
2016/0163796 A1    6/2016   Obradovic et al.

OTHER PUBLICATIONS

S. Barraud et al., Opportunities and Challenges of Nanowire-Based CMOS Technologies, 015 IEEE SOI-3D-Subthreshold Microelectronics Technology Unified Conference (S3S), Rohnert Park, CA, Oct. 2015, pp. 1-3.

P. Nguyen et al., Dual-Channel CMOS Co-Integration with Si NFET and Strained-SiGe PFET in Nanowire Device Architecture Featuring Sub-15nm Gate Length, 2014 IEEE International Electron Devices Meeting, San Francisco, CA, Dec. 2014, pp. 16.2.1-16.2.4.

Masanori Tanaka et al., Abnormal Oxidation characteristics of SiGe/Si-on-insulator structures dependong on piled-up GE fraction at SiO2/SiGe interface, Journal of Applied Physics 103, Mar. 2008.

* cited by examiner

NANOSHEET CMOS TRANSISTORS

BACKGROUND

Technical Field

The present invention generally relates to semiconductor device fabrication and, more particularly, to the formation of transistors having nanosheet channels.

Description of the Related Art

Field effect transistors (FETs) are semiconductor devices that use an electric field generated by a gate structure to influence the behavior of charge carriers within a semiconductor channel structure. The geometry of the channel structure can significantly impact the electrical properties of the device. N-type field effect transistors (NFET) and p-type field effect transistors (PFET) are two types of complementary metal oxide semiconductor FETs (MOSFETs). The NFET uses electrons as the current carriers and with n-doped source and drain junctions. The PFET uses holes as the current carriers and with p-doped source and drain junctions.

Nanosheet channel structures present one option for scaling device architectures to smaller sizes. Nanosheet (or nanowire) FET devices are considered to be a viable option for continued CMOS to the 7 nm node and beyond. However, current nanosheet fabrication processes use epitaxial processes that result in relatively low-quality nanosheet structures, resulting in poor device performance. In addition, in conventional nanosheet CMOS integration processes, silicon germanium sacrificial layers are removed and silicon layers are used as channels in nFET device regions, while silicon sacrificial layers are removed and silicon germanium layers are used as channels in pFET device regions. This will introduce topography issues in the downstream device fabrication processes since the channels in the respective regions would be offset relative to each other and thus would not be at the same level in the final device.

SUMMARY

A method of forming semiconductor devices includes forming a respective stack of sheets in two regions, each stack having first layers and second layers. The second layers are etched away in the first region. The second region is annealed to change the composition of the first layers in the second region by interaction with the second layers in the second region. A gate stack is formed in the first and second region.

A method of forming semiconductor devices includes forming a respective stack of sheets in two regions. Each stack has first layers, second layers, and third layers. The first layers consist of silicon the second layers comprise silicon germanium at a first concentration, and the third layers include silicon germanium at a second, higher concentration. The second and third layers are recessed relative to the first layers. Dielectric spacers are formed on sidewalls of the second and third layers. Source and drain regions are grown from exposed sidewalls of the first layers. The second layers are etched away in the first region. The second region is annealed to change the composition of the first layers in the second region by interaction with the second layers in the second region. An oxide layer that remains on surfaces of the first layers after annealing is etched away. A gate stack is formed in the first and second region.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide silicon and silicon germanium nanosheet channel transistors on a single chip. Rather than growing the silicon germanium nanosheet structures epitaxially, existing silicon nanosheets are annealed to convert those structures into silicon germanium nanosheets. The resulting silicon germanium channels are formed with a higher quality than epitaxially grown structures would be and are co-planar with the silicon channel structures that are formed on the same chip.

Figure 1:
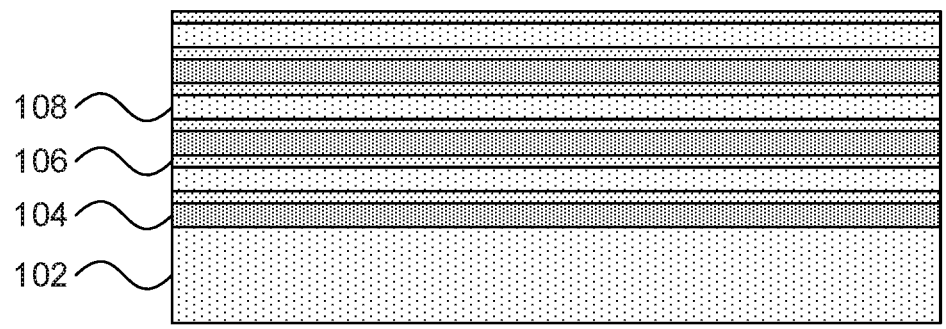
FIG. 1 is a cross-sectional diagram of a step in the formation of nanosheet field effect transistor (FET) devices in accordance with one embodiment of the present invention.

Referring now to FIG. 1, a cross-sectional view of a step in the fabrication of a nanosheet field effect transistor (FET) is shown. A stack of semiconductor layers is formed on a semiconductor substrate 102. The semiconductor substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 102 may also be a semiconductor on insulator (SOI) substrate.

The stack of layers is formed from three different compositions. It is specifically contemplated that the first set of layers 104 can be formed from silicon germanium at a first germanium concentration (e.g., about 40% to about 50%), that the second set of layers 106 can be formed from silicon germanium at a second concentration (e.g., about 10% to about 20%), and that the third set of layers 108 can be formed from silicon. These concentrations are selected to provide appropriate etch selectivity between the first layers 104 and second layers 106. It should be understood, however, that other compositions and other concentrations may be selected. The layers are deposited with a pattern ABCBABCBA . . . , where A represents the first set of layers 104, B represents the second set of layers 106, and C represents the third set of layers.

In one exemplary embodiment, the thickness of the first layers 104 and of the third layers 108 may be about 5 nm to about 20 nm thick, while the thickness of the second layers 106 may be about 2 nm to about 6 nm thick. In another exemplary embodiment, the thickness of first layers 104 and third layers 108 may be between about 10 nm to about 12 nm and the thickness of the second layers 106 may be about 3 nm to about 5 nm. Greater and smaller thicknesses are also contemplated.

Each of the layers may be formed on top of the previous layer by epitaxial growth or any other appropriate deposition process. Epitaxial growth at this stage can be performed with relatively high quality, as each previous layer provides a good seed layer for the growth of the next layer. The terms "epitaxial growth" and "epitaxial deposition" refer to the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

Figure 2:
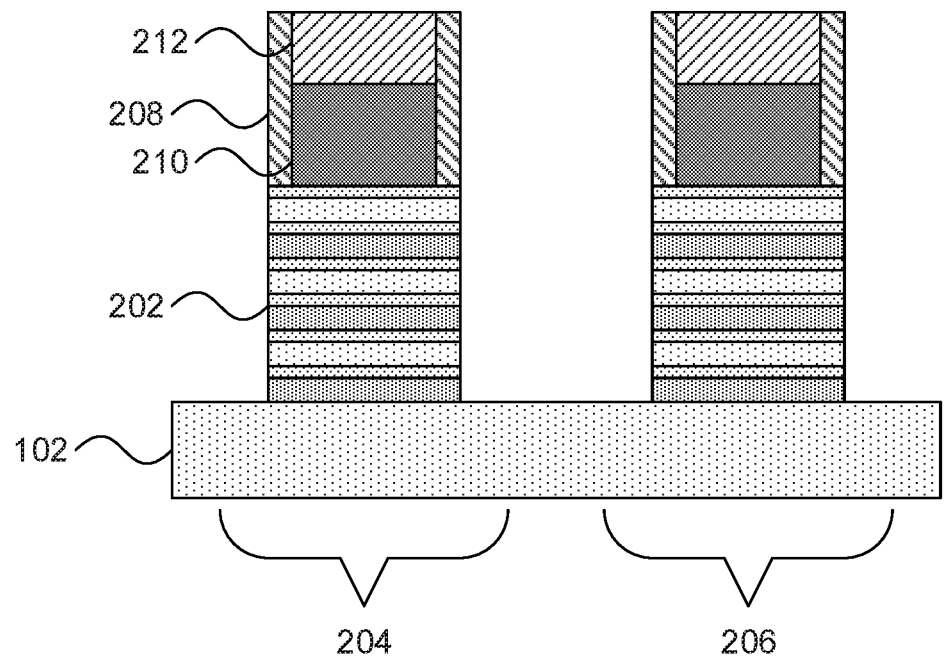
FIG. 2 is a cross-sectional diagram of a step in the formation of nanosheet FET devices in accordance with one embodiment of the present invention.

Referring now to FIG. 2, a cross-sectional view of a step in the fabrication of a nanosheet FET is shown. A dummy gate stack is formed on the stack of layers. The dummy gate stack includes a dummy gate 210 formed from, e.g., polysilicon and a spacer formed from, e.g., silicon nitride, a dummy gate hardmask 212 formed from, e.g., any appropriate hardmask material, and a dummy gate spacer 208 formed from, e.g., silicon nitride. The dummy gate stack is used as a mask to anisotropically etch the stack of layers, forming sheet stacks 202. The sheet stacks 202 are formed in at least two regions, including a first region 204 and a second region 206. In some embodiments, the first region 204 is used to form an n-type FET with silicon nanosheet channels while the second region 206 is used to form a p-type FET with silicon germanium nanosheet channels. The sheet stacks 202 may have any appropriate geometry, with the width of the sheet stacks 202 determining the eventual width of the FET channel regions.

In one embodiment, the sheet stacks 202 may be formed by a selective reactive ion etch (RIE) using the dummy gate stack as a mask. RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

It should be noted that, although the present embodiments are specifically described with respect to nanosheets, the same principles apply to the fabrication of nanowire devices. As used herein, the term "nanosheet" refers to a structure that has a ratio of its cross-sectional width to its cross-sectional height greater than about 2:1, whereas the term "nanowire" refers to a structure that has a ratio of its cross-sectional width to its cross-sectional height less than about 2:1. The shape of the sheet stacks 202 determines whether a "nanosheet" structure or a "nanowire" structure is formed.

Figure 3:
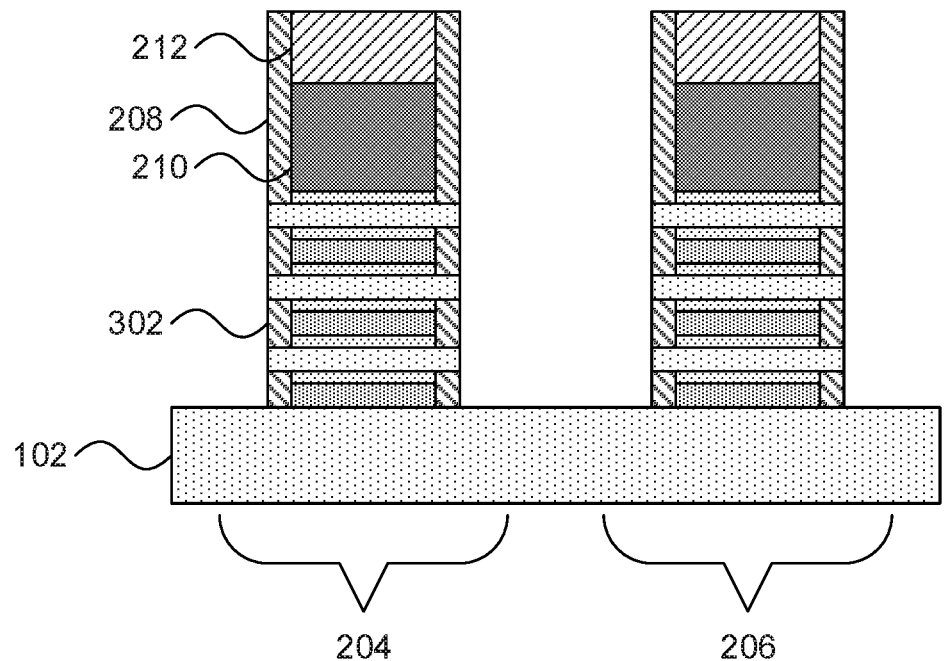
FIG. 3 is a cross-sectional diagram of a step in the formation of nanosheet FET devices in accordance with one embodiment of the present invention.

Referring now to FIG. 3, a cross-sectional view of a step in the fabrication of a nanosheet FET is shown. The first and second layers 104 and 106 are recessed relative to the third layers 108 using a selective isotropic etch. In a specific embodiment, the selective isotropic etch preferentially removes silicon germanium material, leaving layers of silicon relatively untouched.

Additional spacer material 302 is then formed at the recessed ends of the first and second layers 104 and 106 in the sheet stacks 202. This additional spacer material 302 may be deposited using, e.g., a conformal deposition process and subsequently anisotropically etched back to remove excess spacer material on the vertical sidewalls of the nanosheet stack structure and on the surface of the semiconductor substrate 102, with the additional spacer material 302 being protected by the dummy gate stack above it.

The additional spacer material 302 may be formed from the same material as the spacer layer of the dummy gate stack 208 (e.g., silicon nitride). For example, the embedded spacer material 302 can be formed of silicon nitride, silicoboron carbonitride, silicon carbonitride, silicon carbon oxynitride, or any other type of dielectric material (e.g., a dielectric material having a dielectric constant k of less than 5) appropriate to the role of forming an insulating gate sidewall spacers of FET devices.

In one embodiment, the dielectric material is conformally deposited using a highly conformal deposition process, such as atomic layer deposition (ALD), to ensure that the recesses area are sufficiently filled with dielectric material. Other deposition methods such as chemical vapor deposition (CVD), physical vapor deposition (PVD) and PVD can be used to deposit a highly conformal layer of dielectric material to fill the recesses area. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface.

Figure 4:
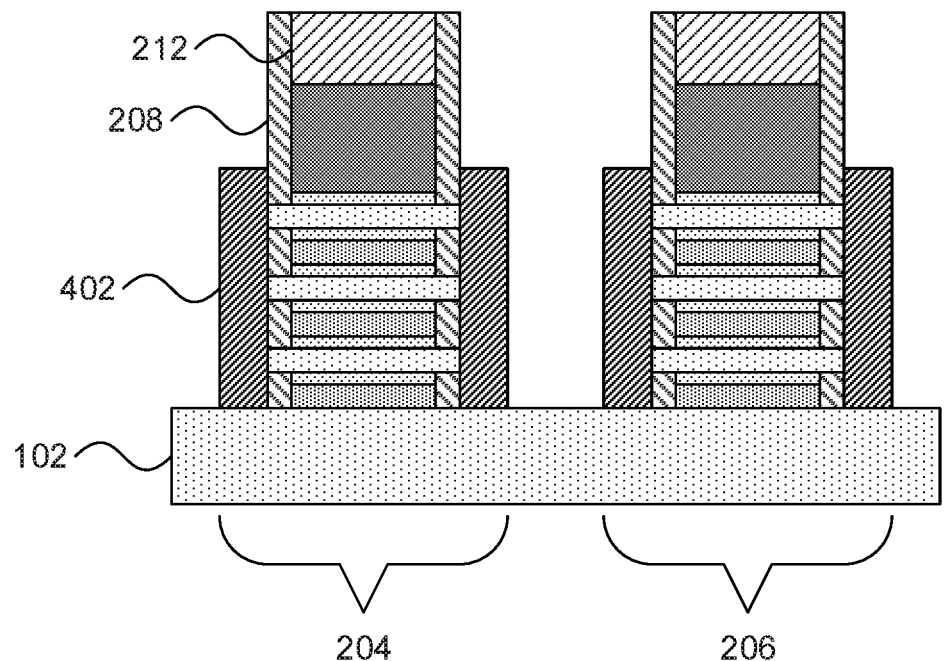
FIG. 4 is a cross-sectional diagram of a step in the formation of nanosheet FET devices in accordance with one embodiment of the present invention.

Referring now to FIG. 4, a cross-sectional view of a step in the fabrication of a nanosheet FET is shown. Source and drain regions 402 are formed in contact with the ends of the layers of the third material 108. In one embodiment, the source and drain regions 402 may be epitaxially grown from these surfaces and in situ doped with a conductivity type appropriate to the type of device being fabricated.

As used herein, the term "conductivity type" denotes a dopant region being p-type or n-type. As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium. As used herein, "n-type" refers to the addition of impurities that contributes free electrons to an intrinsic semiconductor. In a silicon containing substrate, examples of n-type dopants, i.e., impurities, include but are not limited to antimony, arsenic and phosphorous.

Figure 5:
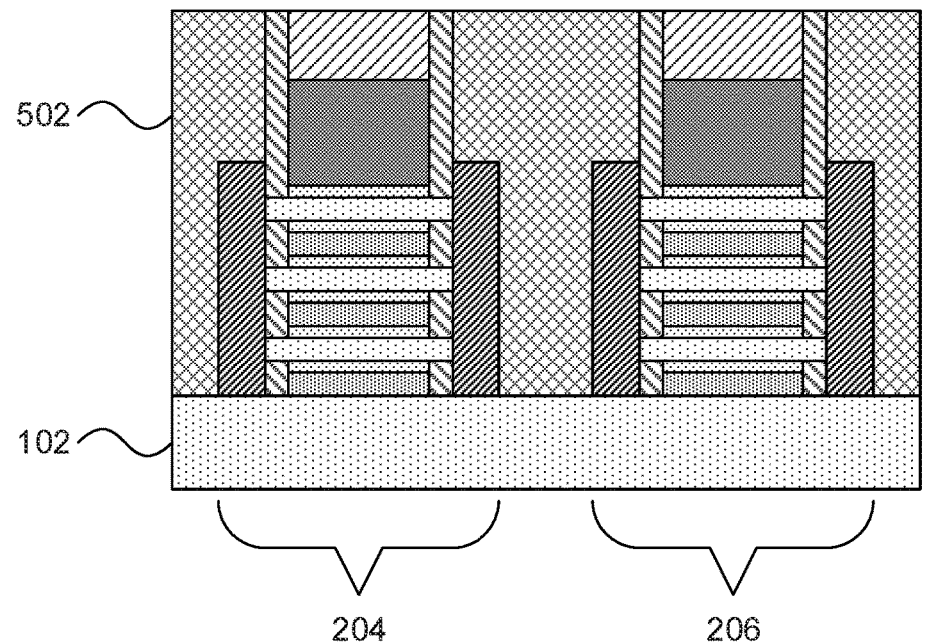
FIG. 5 is a cross-sectional diagram of a step in the formation of nanosheet FET devices in accordance with one embodiment of the present invention.

Referring now to FIG. 5, a cross-sectional view of a step in the fabrication of a nanosheet FET is shown. A dielectric material is formed over and around the regions 204 and 206 and is then polished down to the level of dummy gate hardmask 212 using, e.g., a chemical mechanical planarization (CMP) process to form inter-layer dielectric 502. CMP is performed using, e.g., a chemical or granular slurry and mechanical force to gradually remove upper layers of the device. The slurry may be formulated to be unable to dissolve, for example, the work function metal layer material, resulting in the CMP process's inability to proceed any farther than that layer.

Figure 6:
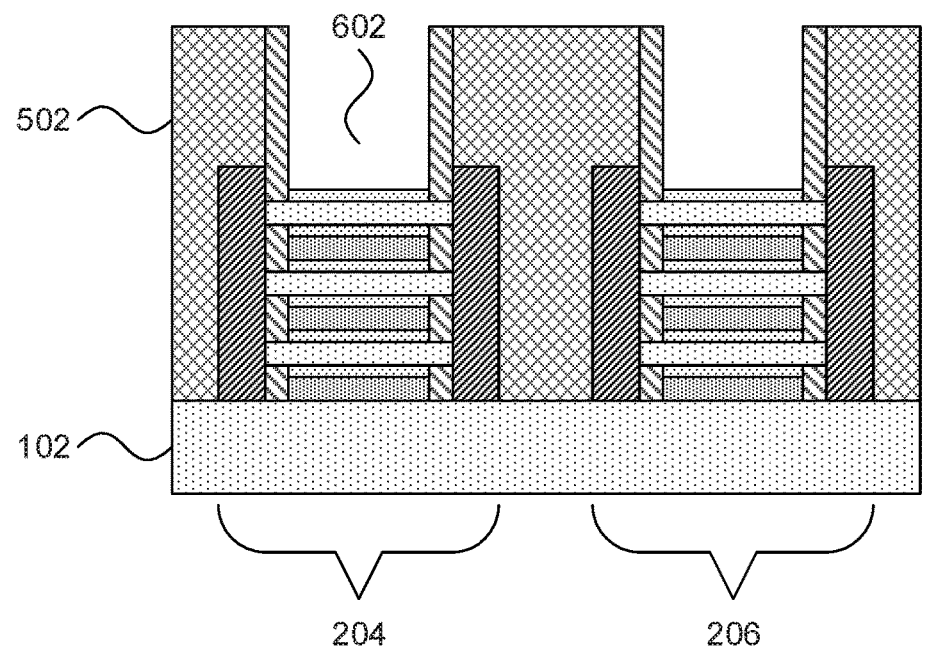
FIG. 6 is a cross-sectional diagram of a step in the formation of nanosheet FET devices in accordance with one embodiment of the present invention.

Referring now to FIG. 6, a cross-sectional view of a step in the fabrication of a nanosheet FET is shown. The dummy gate 210 and the dummy gate hardmask 212 are removed by any appropriate etching process, exposing the underlying sheet stacks 202 and forming an opening 602.

Figure 7:
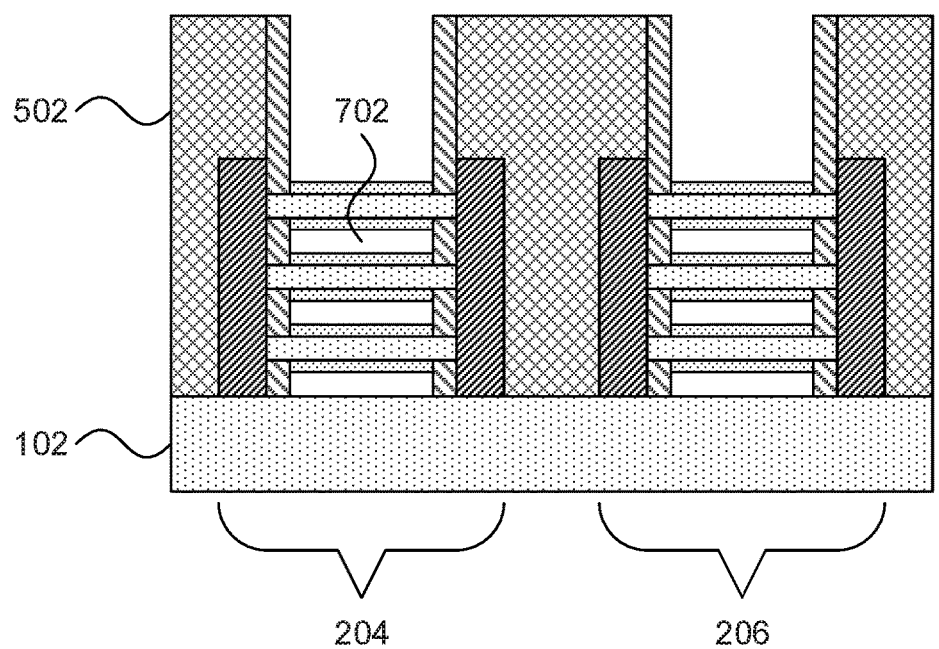
FIG. 7 is a cross-sectional diagram of a step in the formation of nanosheet FET devices in accordance with one embodiment of the present invention.

Referring now to FIG. 7, a cross-sectional view of a step in the fabrication of a nanosheet FET is shown. The layers of the first material (e.g., silicon germanium with a relatively high concentration of germanium) are selectively etched away in both the first and second region 204 and 206. This leaves openings 702 between layers of the third material 108, with layers of the second material 106 remaining on the surfaces of the sheets of the third material 108.

Figure 8:
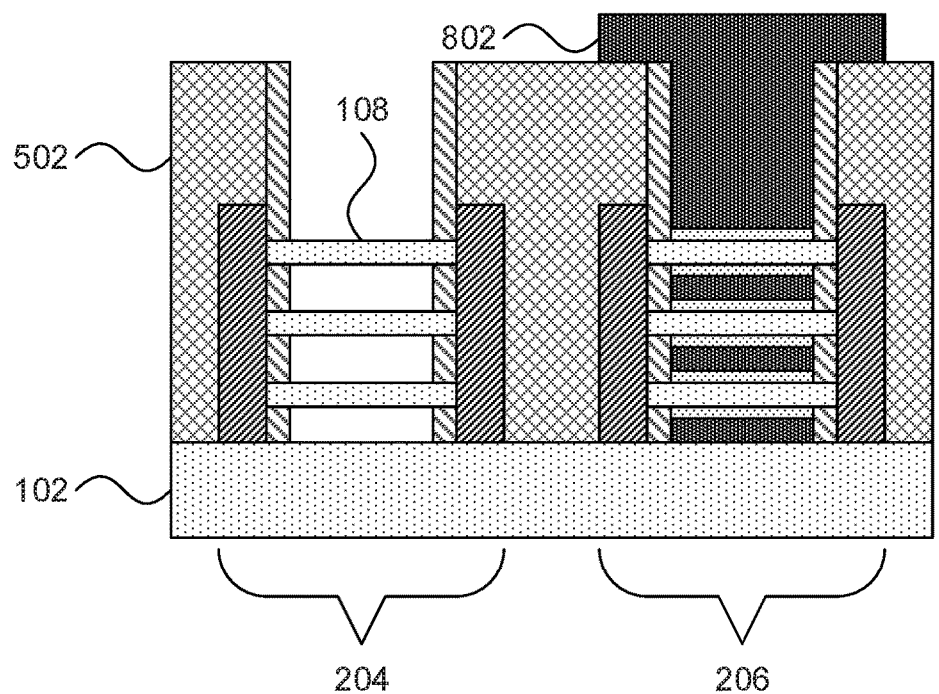
FIG. 8 is a cross-sectional diagram of a step in the formation of nanosheet FET devices in accordance with one embodiment of the present invention.

Referring now to FIG. 8, a cross-sectional view of a step in the fabrication of a nanosheet FET is shown. The p-type FET region 206 is masked using any appropriate masking material 802. The layers of the second material 106 are etched away in the n-type FET region 204 using any appropriate isotropic etch that selectively removes the second material without harming the layers of the third material 108.

Figure 9:
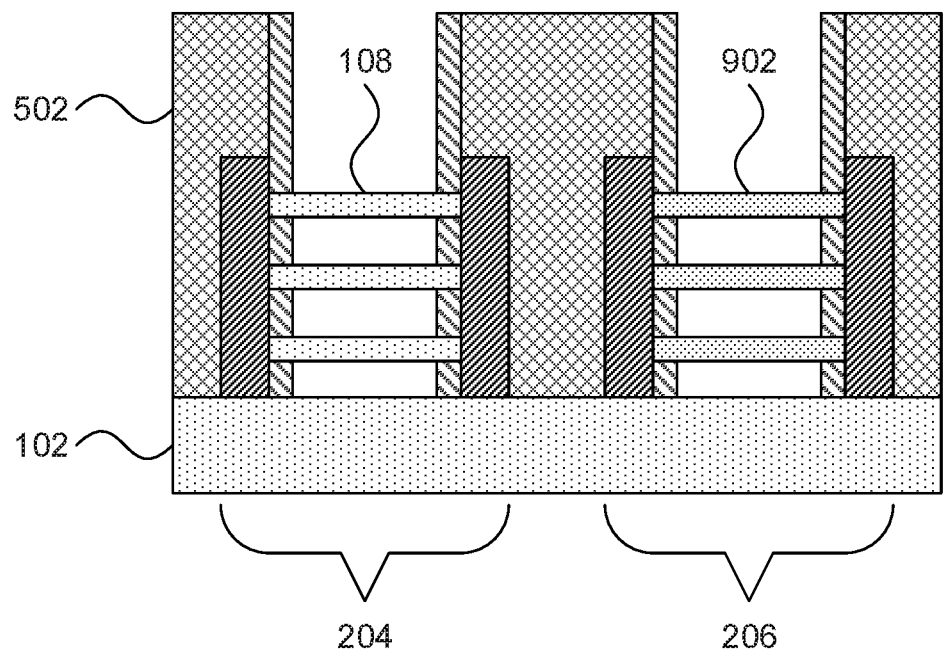
FIG. 9 is a cross-sectional diagram of a step in the formation of nanosheet FET devices in accordance with one embodiment of the present invention.

Referring now to FIG. 9, a cross-sectional view of a step in the fabrication of a nanosheet FET is shown. The mask 802 is removed to expose the layers of the second material 106 and the layers of the third material 108 in the p-type FET region 206. A low-temperature anneal is performed, causing the layers of the second material 106 to combine with the layers of the third material 108 to form annealed layers 902. It should be noted that the resulting annealed layers 902 remain at a same height as the respective layers of the third material 108 that remain in the first region 204.

During the anneal, the silicon germanium layer 106 goes through a condensation process in which the third layers 108 turn into silicon germanium. The condensation process is essentially an oxidation of the material of the second layers 106. The thermal anneal process may be performed in an oxidation process using oxygen or water vapor. In embodiments that employ silicon germanium in the second layers 106 and silicon in the third layers 108, the oxygen is attracted to the silicon in the silicon germanium during oxidation, but not to the germanium. As a result, the silicon in the silicon germanium and the oxygen react to form silicon oxide. The germanium in the silicon germanium layer, however, is pushed to the silicon sheet and mixes with the silicon therein to form silicon germanium.

The condensation processing conditions may include an oxygen pressure of about 10 Torr to about 1000 Torr and a temperature of about 650° C. to about 850° C. for about 2 seconds to about 30 minutes depending on the temperature and oxygen pressure. At this low temperature range, the silicon germanium is oxidized much faster than the silicon sheets in nFET region 204. The much thinner oxide formed on silicon sheets in nFET region 204 and the oxide formed in pFET region 206 can be removed by an isotropic wet etch process. For Example, if the second layers 106 are about 5 nm thick with a 20% germanium concentration, and if the third layers 108 are about 10 nm thick, the final germanium concentration in the annealed layers 902 in pFET region 206 will be about (20%*5+20%*5)/10=20%.

Figure 10:
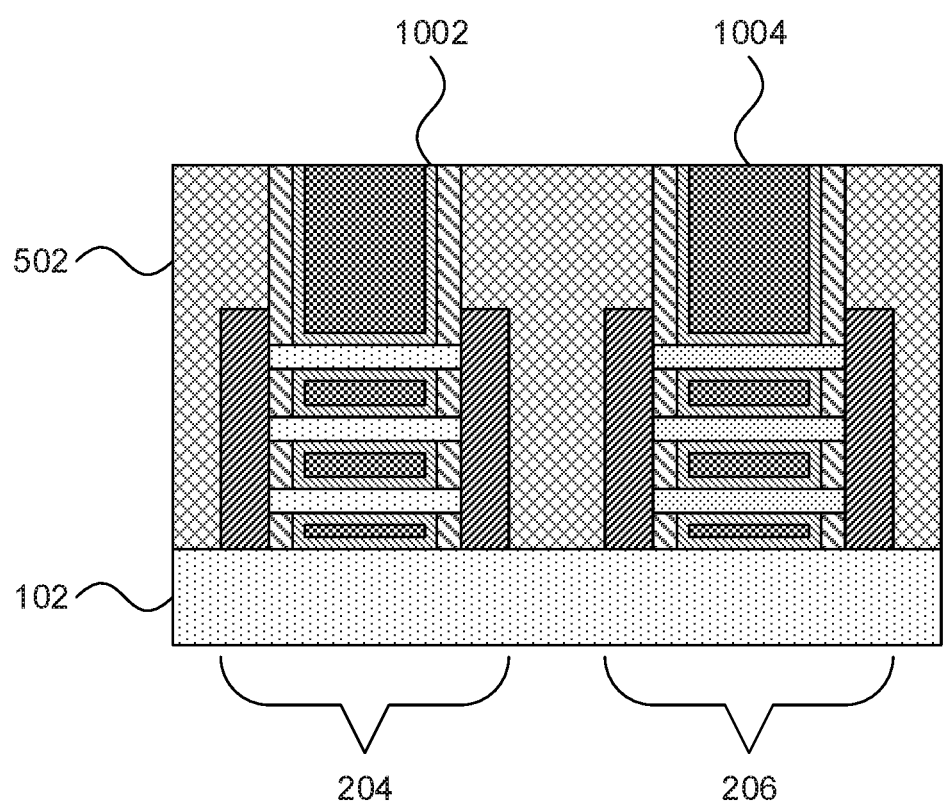
FIG. 10 is a cross-sectional diagram of a step in the formation of nanosheet FET devices in accordance with one embodiment of the present invention.

Referring now to FIG. 10, a cross-sectional view of a step in the fabrication of a nanosheet FET is shown. A gate stack is formed from a gate dielectric 1002 and a gate conductor 1004. The gate dielectric 1002 may be formed by any conformal deposition process including, e.g., CVD or ALD and may include any appropriate dielectric material.

It is specifically contemplated that the gate dielectric 1002 may be formed from a high-k dielectric material, which is defined as a material having a dielectric constant k that is greater than the dielectric constant of silicon dioxide. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric material may further include dopants such as lanthanum and aluminum.

The gate conductor 1004 may be, for example, a metal or metallic conductive material including, e.g., tungsten, nickel, titanium, molybdenum, tantalum, copper, platinum, silver, gold, ruthenium, iridium, rhenium, rhodium, and alloys thereof. The gate conductor may alternatively include a doped semiconductor material such as, e.g., doped polysilicon. When a combination of conductive elements is employed, an optional diffusion barrier material such as tantalum nitride or tungsten nitride may be formed between the conductive materials.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper", and the like, can be used herein for ease of description to describe one element's or feature's relationship to another element(s) or feature(s) as illustrated in the FIGS. It will be understood that the spatially relative terms are intended to encompass different orientations of the device use or operation in addition to the orientation depicted in the FIGS. For example, if the device in the FIGS. is turned over, elements described as "below" or "beneath" other elements or features would then be oriented "above" the other elements or features. Thus, the term "below" encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 11:
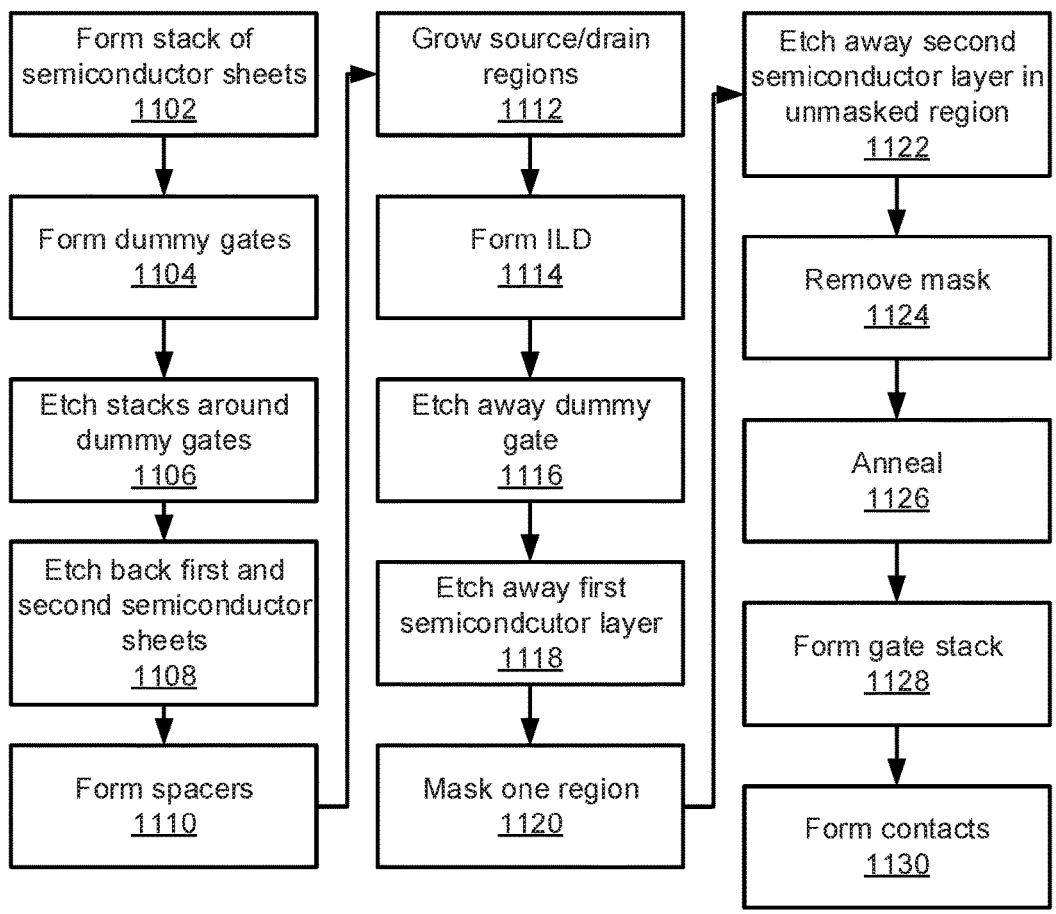
FIG. 11 is a block/flow diagram of a method of forming nanosheet FET devices in accordance with one embodiment of the present invention.

Referring now to FIG. 11, a method of forming a nanosheet FET is shown. Block 1102 forms the stack of semiconductor sheets, including sheets of the first material 104, sheets of the second material 106, and sheets of the third material 108, on the semiconductor substrate 102. These sheets may be formed by any appropriate process, including epitaxial growth, CVD, ALD, or PVD. As noted above, in some embodiments the first material may include silicon germanium with a relatively high germanium concentration, the second material may include silicon germanium with a relatively low germanium concentration, and the third material may include only silicon. Block 1104 forms dummy gate stacks on the sheet stacks, including a dummy gate 210, a dummy gate hardmask 212, and spacers 208. Block 1106 etches down into the underlying stack of sheets to form sheet stacks 202 in at least two regions, including nFET region 204 and pFET region 206.

Block 1108 etches back the first and second semiconductor sheets 104 and 106, recessing these layers relative to the layers of the third semiconductor material 108. Block 1110 forms spacers 302 in the recessed areas by, e.g., conformally depositing spacer material and anisotropically etching away any spacer material that extends beyond the layers of the third semiconductor material 108. Block 1112 forms source and drain regions at the exposed ends of the layers of the third semiconductor material 108 by, e.g., epitaxially growing in situ doped semiconductor material.

Block 1114 forms an inter-layer dielectric 502 that is polished down to the level of the dummy gate hardmask 212. Block 1116 etches away the dummy gate hardmask 212 and the dummy gate 210, exposing the sheet stacks. Block 1118 etches away the layers of first semiconductor material 104 using any appropriate isotropic etch. Block 1120 then masks the pFET region 206 and block 1122 etches away the layer of second semiconductor material 106 in the nFET region 204. Block 1124 removes the mask 802.

Block 1126 performs an anneal, causing the second semiconductor material to react with the third semiconductor material. In embodiments that use low-Ge silicon germanium for the second semiconductor material and silicon for the third semiconductor material, the germanium diffuses into the layers of third semiconductor material. Block 1128 then forms gate stacks in the first and second regions 204 and 206, with a gate dielectric layer 1002 and gate conductor 1004 being conformally deposited around the nanosheets. Block 1130 forms electrical contacts to the gate conductor 1004 and to the respective source and drain regions 402 to provide electrical connections to the devices, completing the FETs.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming semiconductor devices, comprising:
    forming a respective stack of sheets in two regions, each stack comprising first layers and second layers;
    etching away the second layers in the first region;
    annealing the second region to change the composition of the first layers in the second region by interaction with the second layers in the second region; and
    forming a gate stack in the first and second region.

2. The method of claim 1, wherein each stack further comprises third layers formed, wherein the first, second, and third layers are formed with a pattern CBABCBABC . . . , where A, B, and C represent the first, second, and third layers, respectively.

3. The method of claim 2, further comprising recessing the second and third layers relative to the first layers.

4. The method of claim 3, further comprising forming dielectric spacers on sidewalls of the second and third layers.

5. The method of claim 4, further comprising growing source and drain regions from exposed sidewalls of the first layers.

6. The method of claim 2, further comprising selectively etching away the third layers before etching away the second layers in the first region.

7. The method of claim 2, wherein the first layers consist of silicon, the second layers comprise silicon germanium at a first germanium concentration, and the third layers comprise silicon germanium at a second, higher germanium concentration.

8. The method of claim 7, wherein the first layers and the third layers have a thickness between about 5 nm and about 20 nm and wherein the second layers have a thickness between about 2 nm and about 6 nm.

9. The method of claim 8, wherein the first layers and the third layers have a thickness between about 10 nm and about 12 nm and wherein the second layers have a thickness between about 3 nm and about 5 nm.

10. The method of claim 1, further comprising etching away an oxide layer that remains on surfaces of the first layers after annealing.

11. A method of forming semiconductor devices, comprising:
    forming a respective stack of sheets in two regions, each stack comprising first layers, second layers, and third layers, wherein the first layers consist of silicon the second layers comprise silicon germanium at a first concentration, and the third layers comprise silicon germanium at a second, higher concentration;
    recessing the second and third layers relative to the first layers;
    forming dielectric spacers on sidewalls of the second and third layers;
    growing source and drain regions from exposed sidewalls of the first layers;
    etching away the second layers in the first region;
    annealing the second region to change the composition of the first layers in the second region by interaction with the second layers in the second region;
    etching away an oxide layer that remains on surfaces of the first layers after annealing; and
    forming a gate stack in the first and second region.

12. The method of claim 11, wherein the first, second, and third layers are formed with a pattern CBABCBABC . . . , where A, B, and C represent the first, second, and third layers, respectively.

13. The method of claim 11, further comprising selectively etching away the third layers before etching away the second layers in the first region.

14. The method of claim 11, wherein the first layers and the third layers have a thickness between about 5 nm and about 20 nm and wherein the second layers have a thickness between about 2 nm and about 6 nm.

15. The method of claim 14, wherein the first layers and the third layers have a thickness between about 10 nm and about 12 nm and wherein the second layers have a thickness between about 3 nm and about 5 nm.

* * * * *